(12) United States Patent
Takahashi et al.

(10) Patent No.: US 10,952,321 B2
(45) Date of Patent: Mar. 16, 2021

(54) PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Kenji Takahashi, Osaka (JP); Koji Nitta, Osaka (JP); Shoichiro Sakai, Osaka (JP); Junichi Okaue, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 16/621,022

(22) PCT Filed: Aug. 6, 2018

(86) PCT No.: PCT/JP2018/029379
§ 371 (c)(1),
(2) Date: Dec. 10, 2019

(87) PCT Pub. No.: WO2019/039251
PCT Pub. Date: Feb. 28, 2019

(65) Prior Publication Data
US 2020/0107443 A1 Apr. 2, 2020

(30) Foreign Application Priority Data
Aug. 24, 2017 (JP) .............................. JP2017-161416

(51) Int. Cl.
*H05K 1/00* (2006.01)
*H05K 1/02* (2006.01)
(Continued)

(52) U.S. Cl.
CPC ..... *H05K 1/115* (2013.01); *H05K 2201/0344* (2013.01); *H05K 2201/09545* (2013.01); *H05K 2201/09827* (2013.01)

(58) Field of Classification Search
CPC .. H05K 1/00; H05K 1/02; H05K 1/03; H05K 1/09; H05K 1/11; H05K 3/36; H05K 3/42; H05K 3/423
(Continued)

(56) References Cited

U.S. PATENT DOCUMENTS

2002/0170827 A1* 11/2002 Furuya ..................... C25D 5/00
205/131
2006/0055050 A1* 3/2006 Numata ............ H01L 21/76898
257/774
(Continued)

FOREIGN PATENT DOCUMENTS

JP 2000-077809 3/2000
JP 2004-311919 11/2004
(Continued)

*Primary Examiner* — Xiaoliang Chen
(74) *Attorney, Agent, or Firm* — IPUSA, PLLC

(57) ABSTRACT

A printed circuit board according to one aspect of the present invention includes an insulating layer having a through-hole, a conductive layer laminated on an inner circumferential surface of the through-hole, and metal plating layers laminated on a surface of the conductive layer facing opposite the insulating layer and laminated on both surfaces of the insulating layer, wherein an average thickness of the insulating layer is greater than or equal to 5 μm and less than or equal to 50 μm, wherein an average thickness of the metal plating layers is greater than or equal to 3 μm and less than or equal to 50 μm, wherein a hole diameter of the through-hole gradually increases from a first end of the through-hole at one surface of the insulating layer to a second end of the through-hole at another surface of the insulating layer, wherein the hole diameter of the through-hole at the first end
(Continued)

is greater than or equal to 1.5 times, and less than or equal to 2.5 times, the average thickness of the metal plating layers, and wherein the hole diameter of the through-hole at the second end is greater than or equal to 1.1 times, and less than or equal to 2 times, the hole diameter of the through-hole at the first end thereof.

2 Claims, 1 Drawing Sheet

(51) Int. Cl.
    *H05K 1/03* (2006.01)
    *H05K 1/09* (2006.01)
    *H05K 1/11* (2006.01)
    *H05K 3/36* (2006.01)
    *H05K 3/42* (2006.01)

(58) Field of Classification Search
    USPC ....... 174/264, 254, 255, 257, 262, 265, 266; 205/131; 29/830, 852
    See application file for complete search history.

(56) References Cited

U.S. PATENT DOCUMENTS

| | | | | |
|---|---|---|---|---|
| 2006/0289203 A1* | 12/2006 | Oda | ........ | H01L 21/486 174/264 |
| 2007/0199735 A1* | 8/2007 | Kim | ........ | H05K 3/423 174/255 |
| 2008/0257591 A1* | 10/2008 | Ikeda | ........ | H05K 1/119 174/255 |
| 2009/0260868 A1* | 10/2009 | Oh | ........ | H05K 3/4647 174/262 |
| 2010/0307809 A1* | 12/2010 | Noda | ........ | H05K 3/4602 174/266 |
| 2014/0182920 A1* | 7/2014 | Yanagisawa | ........ | H05K 3/0035 174/266 |
| 2016/0205765 A1* | 7/2016 | Takagi | ........ | H05K 1/0215 174/254 |
| 2016/0330836 A1* | 11/2016 | Mizutani | ........ | H05K 3/187 |

FOREIGN PATENT DOCUMENTS

| | | |
|---|---|---|
| JP | 2005-045047 | 2/2005 |
| JP | 2012-160559 | 8/2012 |
| WO | 2015/050111 | 4/2015 |

* cited by examiner

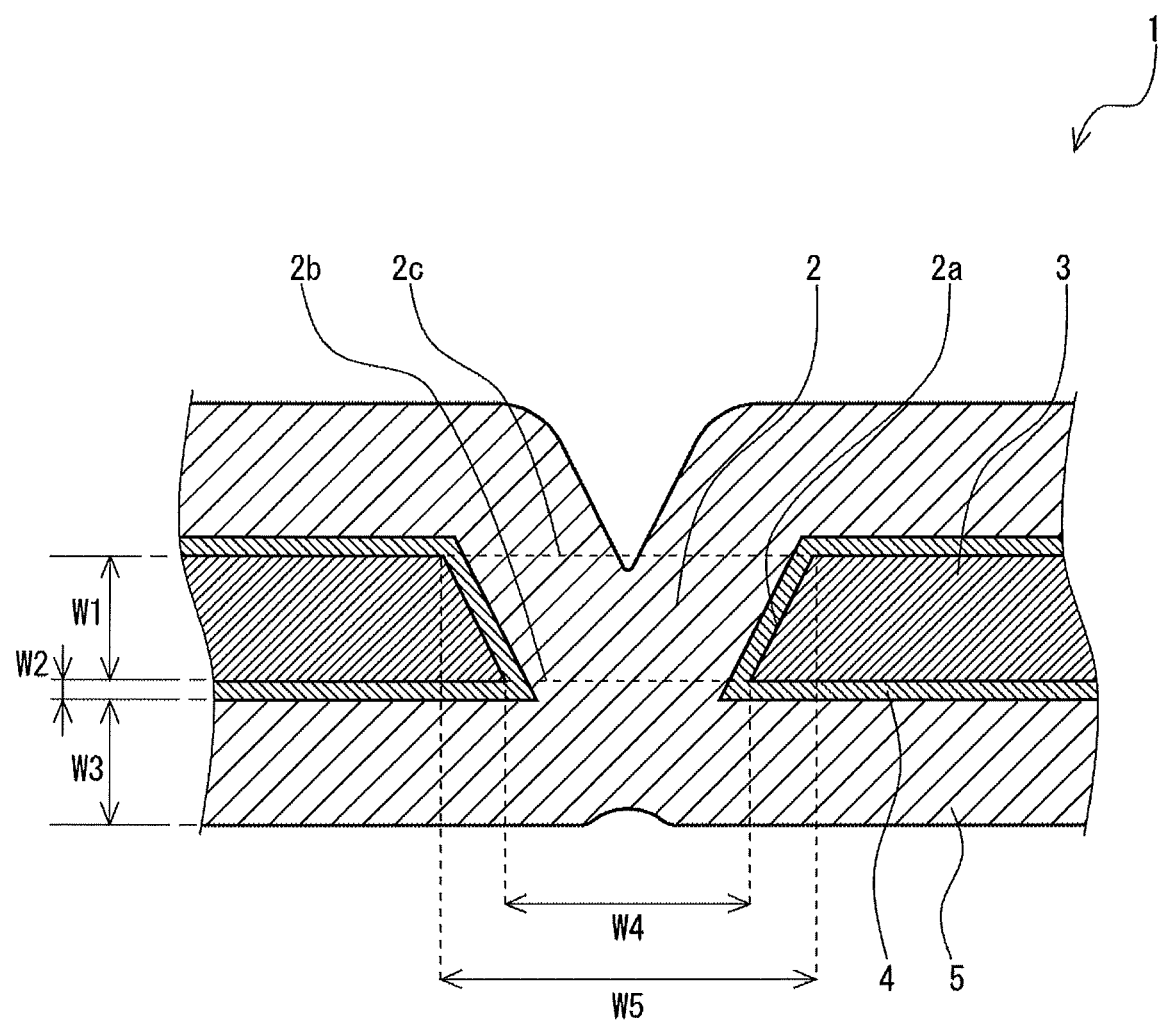

PRINTED CIRCUIT BOARD

TECHNICAL FIELD

The disclosures herein relate to a printed circuit board. The present application claims priority to Japanese patent application No. 2017-161416 filed on Aug. 24, 2017, and the entire contents of the Japanese patent application are hereby incorporated by reference.

BACKGROUND ART

In recent years, as the interconnects of printed circuit boards have become finer and finer, there has been a demand for reduction in the thickness of printed circuit boards and reduction in the size of through-hole vias in printed circuit boards.

Well-known examples of methods for forming through-hole vias in a printed circuit board include a method of applying electrolytic plating to a substrate having through-holes. The substrate disclosed in Patent Document 1 has a narrowest portion formed on the inner circumferential surface of a through-hole. When electrolytic plating is applied to this substrate, plating blocks the through-hole from the narrowest portion of the through-hole toward the entrance, thereby preventing the generation of voids in the through-hole.

RELATED-ART DOCUMENTS

Patent Document

Patent Document 1: Japanese Patent Application Publication No. 2004-311919

SUMMARY OF THE INVENTION

A printed circuit board according to one aspect of the present disclosures includes an insulating layer having a through-hole, a conductive layer laminated on at least an inner circumferential surface of the through-hole of the insulating layer, and layers laminated on a surface of the conductive layer facing opposite the insulating layer and laminated on both surfaces of the insulating layer, wherein an average thickness of the insulating layer is greater than or equal to 5 µm and less than or equal to 50 µm, wherein an average thickness of the conductive layer is greater than or equal to 0.05 µm and less than or equal to 0.5 µm, wherein an average thickness of the layers is greater than or equal to 3 µm and less than or equal to 50 µm, wherein a hole diameter of the through-hole gradually increases from a first end of the through-hole at one surface of the insulating layer to a second end of the through-hole at another surface of the insulating layer, wherein the hole diameter of the through-hole at the first end thereof is greater than or equal to 1.5 times, and less than or equal to 2.5 times, the average thickness of either one of the metal plating layers laminated on both surfaces of the insulating layer, and wherein the hole diameter of the through-hole at the second end thereof is greater than or equal to 1.1 times, and less than or equal to 2 times, the hole diameter of the through-hole at the first end thereof.

BRIEF DESCRIPTION OF THE DRAWINGS

FIG. 1 is a schematic partial cross-sectional view illustrating a printed circuit board according to one embodiment of the present disclosures.

MODE FOR CARRYING OUT THE INVENTION

Problem to be Solved by the Present Disclosures

In the case in which electrolytic plating forms a through-hole via in a printed circuit board, the inner circumferential surface of a through-hole in the substrate needs to have a conductive layer (i.e., seed layer) formed thereon for the purpose of plating deposition. This conductive layer is generally formed by electroless plating. Since electroless plating requires a lengthy time, forming a thin conductive layer is preferable from the viewpoint of production efficiency. However, when the conductive layer formed on the inner circumferential surface of the through-hole becomes thin, the electrical resistance of the conductive layer increases, which creates a risk that the adhesion of plating to the conductive layer during electrolytic plating is insufficient. If plating is not sufficiently adhered to the conductive layer, the plating may be fractured or detached due to stress caused by deformation of a printed circuit board in the case of the printed circuit board being a thin plate such as a flexible printed circuit board.

The present disclosures are made in consideration of the circumstances as described above, and are directed to providing a printed circuit board that can reduce the generation of voids in through-hole vias while satisfying the need for thinning, and that can improve the adhesion of metal plating in through-hole vias.

Advantage of the Present Disclosures

The printed circuit board of the present disclosures can reduce the generation of voids in through-hole vias while satisfying the need for thinning, and can improve the adhesion of metal plating in through-hole vias.

DESCRIPTION OF EMBODIMENTS OF THE PRESENT DISCLOSURES

Embodiments of the present disclosures will be listed and described first.

A printed circuit board according to one aspect of the present disclosures includes an insulating layer having a through-hole, a conductive layer laminated on at least an inner circumferential surface of the through-hole of the insulating layer, and metal plating layers laminated on a surface of the conductive layer facing opposite the insulating layer and laminated on both surfaces of the insulating layer, wherein an average thickness of the insulating layer is greater than or equal to 5 µm and less than or equal to 50 µm, wherein an average thickness of the conductive layer is greater than or equal to 0.05 µm and less than or equal to 0.5 µm, wherein an average thickness of the metal plating layers is greater than or equal to 3 µm and less than or equal to 50 µm, wherein a hole diameter of the through-hole gradually increases from a first end of the through-hole at one surface of the insulating layer to a second end of the through-hole at another surface of the insulating layer, wherein the hole diameter of the through-hole at the first end thereof is greater than or equal to 1.5 times, and less than or equal to 2.5 times, the average thickness of either one of the metal plating layers laminated on both surfaces of the insulating layer, and wherein the hole diameter of the through-hole at the second end thereof is greater than or equal to 1.1 times, and less than or equal to 2 times, the hole diameter of the through-hole at the first end thereof.

The printed circuit board is configured such that an extremely thin insulating layer having substantially the same or similar thickness as a metal plating layer is employed, and the through-hole formed in the insulating layer to become a through-hole via has a tapered shape, thereby reducing the generation of voids in the through-hole via while satisfying the need for thinning. The printed circuit board is configured such that the use of a tapered shape for the through-hole increases the area of the inner circumferential surface of the through-hole, which improves the adhesion of metal plating in the through-hole via even in the case of using an extremely thin insulating layer.

In the printed circuit board according to one aspect of the present disclosures, the average thickness of the insulating layer is greater than or equal to 10 μm and less than or equal to 40 μm, wherein the average thickness of the conductive layer is greater than or equal to 0.15 μm and less than or equal to 0.3 μm, and wherein the average thickness of the metal plating layers is greater than or equal to 10 μm and less than or equal to 30 μm. This configuration can reduce the generation of voids in the through-hole via while satisfying the need for thinning, and improves the adhesion of metal plating in the through-hole via.

Details of Embodiments of the Present Disclosures

In the following, the printed circuit board according to an embodiment of the present disclosures will be described with reference to accompanying drawings.

Printed Circuit Board

A printed circuit board 1 illustrated in FIG. 1 includes an insulating layer 3 having a through-hole 2, a conductive layer 4 that is laminated on at least the inner circumferential surface 2a of the through-hole 2 of the insulating layer 3, and metal plating layers 5 laminated on a surface of the conductive layer 4 facing opposite the insulating layer 3 and laminated on both surfaces of the insulating layer 3. An average thickness W1 of the insulating layer 3 is greater than or equal to 5 μm and less than or equal to 50 μm, and an average thickness W2 of the conductive layer 4 is greater than or equal to 0.05 μm and less than or equal to 0.5 μm, with an average thickness W3 of the metal plating layers 5 being greater than or equal to 3 μm and less than or equal to 50 μm. The hole diameter of the through-hole 2 gradually increases from a first end 2b of the through-hole 2 at one surface of the insulating layer 3 to a second end 2c of the through-hole 2 at another surface of the insulating layer 3. A hole diameter W4 of the through-hole 2 at the first end 2b thereof is greater than or equal to 1.5 times, and less than or equal to 2.5 times, the average thickness W3 of either one of the metal plating layers 5 laminated on both surfaces of the insulating layer 3, and a hole diameter W5 of the through-hole 2 at the second end 2c thereof is greater than or equal to 1.1 times, and less than or equal to 2 times, the hole diameter W4 of the through-hole 2 at the first end 2b thereof. Here, the average thickness refers to the average value of thicknesses measured at 10 random points.

The printed circuit board 1 is a flexible printed circuit board that has flexibility and elasticity, and is implemented as a plate. The printed circuit board 1 is made by using a semi-additive process, for example. Although the printed circuit board 1 is not limited to a particular thickness, the lower limit of the average thickness of the printed circuit board 1 is preferably 11 μm and more preferably 20 μm. Further, the upper limit of the average thickness of the printed circuit board 1 is preferably 150 μm and more preferably 120 μm. When the average thickness of the printed circuit board 1 is less than the lower limit, there may be a risk that the strength of the printed circuit board is insufficient. Conversely, when the average thickness of the printed circuit board 1 is greater than the upper limit, there may be a risk that the thinning of the printed circuit board 1 is insufficient, and, also, there may be a risk that the flexibility and elasticity of the printed circuit board 1 are insufficient. Here, the thickness of the printed circuit board 1 refers to the thickness of a flat plate area other than the area in which the through-hole 2 is formed and the area in which electronic components are mounted.

<Insulating Layer>

The insulating layer 3 is a plate member that constitutes the core of the printed circuit board 1, and has one or more through-holes 2 that extend from the front face to the back face. The insulating layer 3, which provides insulation between the front face and the back face and has flexibility and elasticity, is made of a synthetic resin having a polyimide, a liquid crystal polymer, a fluorine resin, or the like as a main component, for example. Here, the term "main component" refers to a component accounting for the highest content, and refers to a component with a content of 50 wt % or more, for example.

The insulating layer 3 is made very thin in order to satisfy the need for the thinning of the printed circuit board. The lower limit of the average thickness W1 of the insulating layer 3 is preferably 5 μm and more preferably 10 μm. The upper limit of the average thickness W1 of the insulating layer 3 is preferably 50 μm and more preferably 40 μm. When the average thickness W1 of the insulating layer 3 is less than the lower limit, there may be a risk that the strength of the printed circuit board 1 is insufficient, and, also, there may be a risk that the insulating property of the insulating layer is insufficient. Conversely, when the average thickness W1 of the insulating layer 3 is greater than the upper limit, there may be a risk that the thinning of the printed circuit board 1 is insufficient, and, also, there may be a risk that the flexibility and elasticity of the printed circuit board 1 are insufficient.

(Through-Hole)

The through-hole 2 is a hole for forming a through-hole via. The through-hole 2 extends through the insulating layer 3 so that the first end 2b at one surface of the insulating layer 3 is connected to the second end 2c at the other surface of the insulating layer 3. Specifically, the through-hole 2, which is a hole having a shape of a frustum of a right circular cone, has a linear taper on the inner circumferential surface 2a, thereby having a shape such that the hole diameter gradually increases from the first end 2b to the second end 2c. The through-hole 2 may be made by laser machining, for example.

The lower limit of the hole diameter W4 of the through-hole 2 at the first end 2b is preferably 4.5 μm, more preferably 10 μm, and still more preferably 15 μm. The upper limit of the hole diameter W4 is preferably 125 μm, more preferably 100 μm, and still more preferably 80 μm. When the hole diameter W4 is less than the lower limit, there is a risk that the metal plating layer 5 may bulge around the first end 2b due to the fact that plating grows preferentially at the position of the first end 2b. Conversely, when the hole diameter W4 exceeds the upper limit, there is a risk that the through-hole-via area becomes excessively large.

The lower limit of the hole diameter W5 of the through-hole 2 at the second end 2c is preferably 5 μm, more preferably 13 μm, and still more preferably 20 μm. The upper limit of the hole diameter W5 is preferably 250 μm, more preferably 200 μm, and still more preferably 160 μm. When the hole diameter W5 is less than the lower limit, the preferential growth of plating readily occurs not only at the position of the first end 2b but also at the position of the second end 2c, which results in a risk of voids being generated in the through-hole 2. Conversely, when the hole diameter W5 exceeds the upper limit, there is a risk that the through-hole-via area becomes excessively large.

The lower limit of the taper rate (W5−W4)/W1 with respect to the inner circumferential surface 2a of the through-hole 2 is preferably 1/10, more preferably 1/6, and still more preferably 1/4. The upper limit of the taper rate (W5−W4)/W1 is preferably 1, more preferably 4/5, and still more preferably 2/3. When the taper rate (W5−W4)/W1 is less than the lower limit, there is a risk of the generation of voids in the through-hole 2.

Conversely, when the taper rate (W5−W4)/W1 exceeds the upper limit, there is a risk that the through-hole-via area becomes excessively large.

The lower limit of a ratio W5/W4 of the hole diameter W5 of the through-hole 2 at the second end 2c to the hole diameter W4 at the first end 2b is preferably 1.1, more preferably 1.2, and still more preferably 1.3. The upper limit of the ratio W5/W4 is preferably 2, more preferably 1.8, and still more preferably 1.7. When the ratio W5/W4 is less than the lower limit, there is a risk of the generation of voids in the through-hole 2. Conversely, when the ratio W5/W4 exceeds the upper limit, there is a risk that the through-hole-via area becomes excessively large.

<Conductive Layer>

The conductive layer 4, which is a conductive thin film layer that is laminated on the surface of the insulating layer 3, is provided for the purpose of depositing plating at the time of electrolytic plating to form the metal plating layers 5. The conductive layer 4 is formed by, for example, electroless plating using a metal plating such as copper, sputtering using a metal such as copper as a target, applying a conductive ink containing conductive particles such as carbon particles or metal particles, sintering of metal particles, or the like. It may be noted that the conductive layer may preferably be formed by electroless plating using copper from the standpoint of the productivity of the printed circuit board 1 and the ease of controlling the thickness of the conductive layer 4. In the printed circuit board 1 illustrated in FIG. 1, the conductive layer 4 is continuously laminated on both surfaces of the insulating layer 3 and on the inner circumferential surface 2a of the through-hole 2 of the insulating layer 3. Notwithstanding this, it may suffice for the conductive layer 4 to be laminated on at least the inner circumferential surface 2a of the through-hole 2 of the insulating layer 3, without being laminated on either surface of the insulating layer 3.

The conductive layer 4 is substantially uniform in thickness, and is extremely thin from the standpoint of production efficiency. The lower limit of the average thickness W2 of the conductive layer is preferably 0.05 μm, more preferably 0.10 μm, and still more preferably 0.15 μm. The upper limit of the average thickness W2 of the conductive layer 4 is preferably 0.5 μm, more preferably 0.4 μm, and still more preferably 0.3 μm. When the average thickness W2 of the conductive layer 4 is less than the lower limit, the electrical resistance of the conductive layer 4 increases, which creates a risk that the adhesion of plating to the conductive layer during electrolytic plating is insufficient.

Conversely, when the average thickness W2 of the conductive layer 4 exceeds the upper limit, the time required for forming the conductive layer 4 by electroless plating may be prolonged, which creates a risk of reduction in production efficiency.

<Metal Plating Layer>

The metal plating layers 5, which are laminated on both surfaces of the insulating layer 3 and on the surface of the conductive layer 4 facing opposite the insulating layer 3, is formed by electrolytic plating. Plating used to form the metal plating layers 5 includes, for example, copper plating.

When the hole diameter W4 of the through-hole 2 at the first end 2b is large, the metal plating layer 5 inside the through-hole 2 is laminated on, and extends along, the inner circumferential surface 2a of the through-hole 2. However, when the hole diameter W4 of the through-hole 2 at the first end 2b is small to some extent, as illustrated in FIG. 1, the metal plating layer 5 is laminated to block only a part of the through-hole 2 around the first end 2b or to block the entirety of the through-hole 2. Further, the metal plating layers 5 on both surfaces of the insulating layer 3 are laminated with substantially a uniform thickness, and are electrically connected to each other through the metal plating layer 5 inside the through-hole 2.

Although the metal plating layer 5 inside the through-hole 2 and the metal plating layers 5 on both surfaces of the insulating layer 3 are continuously formed, the thickness of the metal plating layers 5 around the first end 2b and the second end 2c of the through-hole 2 may become uneven due to the fact that the preferential growth of plating readily occurs at the edge of the through-hole 2. In addition, although the thicknesses of the metal plating layers 5 on both surfaces of the insulating layer 3 are the same in the printed circuit board 1 illustrated in FIG. 1, the thicknesses of the metal plating layers 5 on both surfaces of the insulating layer 3 may be different from each other.

The lower limit of the average thickness of the metal plating layers 5 is preferably 3 μm, more preferably 5 μm, and still more preferably 10 μm. The upper limit of the average thickness of the metal plating layers 5 is preferably 50 μm, more preferably 40 μm, and still more preferably 30 μm. When the average thickness of the metal plating layers 5 is less than the lower limit, there is a risk that bonding between the metal plating layers 5 and electronic components mounted on the printed circuit board 1 may be difficult. Conversely, when the average thickness of the metal plating layers 5 is greater than the upper limit, there may be a risk that the thinning of the printed circuit board 1 is insufficient, and, also, there may be a risk that the flexibility and elasticity of the printed circuit board 1 are insufficient. Here, the thickness of the metal plating layers 5 refers to the thickness of the metal plating layer 5 laminated on one surface of the insulating layer 3 or the thickness of the metal plating layer 5 laminated on the other surface of the insulating layer 3.

The hole diameter of the through-hole 2 at the smaller diameter side is determined in relation to the thickness of the metal plating layers 5. Namely, the lower limit of a ratio W4/W3 of the hole diameter W4 of the through-hole 2 at the first end 2b to the average thickness W3 of any one of the metal plating layers 5 laminated on both surfaces of the insulating layer 3 is preferably 1.5, more preferably 1.6, and still more preferably 1.7. The upper limit of the ratio W4/W3 is preferably 2.5, more preferably 2.4, and still more preferably 2.3. When the ratio W4/W3 is less than the lower limit, the thickness of the metal plating layers 5 around the edges of the through-hole 2 may become uneven due to the fact that the electrolytic plating continues after the first end 2b of the through-hole 2 is closed by the plating during electrolytic plating. Conversely, when the ratio W4/W3 exceeds the upper limit, there is a risk that the through-hole-via area becomes excessively large.

(Advantage)

The printed circuit board 1 is configured such that the extremely thin insulating layer 3 having substantially the same or similar thickness as the metal plating layers 5 is employed, and the through-hole 2 formed in the insulating layer 3 to become a through-hole via has a tapered shape, thereby reducing the generation of voids in the through-hole via while satisfying the need for thinning. The printed circuit board 1 is further configured such that the use of a tapered shape for the through-hole increases the area of the inner circumferential surface 2a of the through-hole 2, which improves the adhesion of metal plating in the through-hole via even in the case of using the extremely thin insulating layer 3.

Other Embodiments

The embodiments disclosed herein should be regarded in all respects as examples only and as non-limiting. The scope of the present invention is defined by the claims without being limited to the configurations of the disclosed embodiments, and is intended to include all modifications within the spirit and equivalents of the scope of the claims.

Although the above embodiments have been described with respect to a case in which a semi-additive process is employed to make the printed circuit board, the printed circuit board may alternatively be made by using a subtractive process. Such an arrangement employs, rather than the insulating layer 3, a double-sided copper lamination plate that has a pair of copper foils laminated on both surfaces of an insulating layer, so that it suffices for the conductive layer 4 to be laminated on the inner circumferential surface of the through-hole provided in the double-sided copper lamination plate.

DESCRIPTION OF REFERENCE SYMBOLS 1 printed circuit board
2 through-hole
2a inner circumferential surface
2b first end
2c second end
3 insulating layer
4 conductive layer
5 metal plating layer

The invention claimed is:

1. A printed circuit hoard, comprising:
an insulating layer having a through-hole;
a conductive layer laminated on at least an inner circumferential surface of the through-hole of the insulating layer; and
metal plating layers laminated on a surface of the conductive layer facing opposite the insulating layer and laminated on both surfaces of the insulating layer,
wherein an average thickness of the insulating layer is greater than or equal to 5 μm and less than or equal to 50 μm,
wherein an average thickness of the conductive layer is greater than or equal to 0.05 μm and less than or equal to 0.5 μm,
wherein an average thickness of the metal plating layers is greater than or equal to 3 μm and less than or equal to 50 μm,
wherein a hole diameter of the through-hole, gradually increases from a first end of the through-hole at one surface of the insulating layer to a second end of the through-hole at another surface of the insulating layer,
wherein the hole diameter of the through-hole at the first end thereof is greater than or equal to 1.7 times, and less than or equal to 2.3 times, the average thickness of either one of the metal plating layers laminated on both surfaces of the insulating layer,
wherein the hole diameter of the through-hole at the second end thereof is greater than or equal to 1.1 times, and less than or equal to 2 times, the hole diameter of the through-hole at the first end thereof, and
wherein the metal plating layers include a first portion disposed in contact with the one surface of the insulating layer, a second portion disposed at the first end of the through-hole, a third portion disposed at the second end of the through-hole, and a fourth portion disposed in contact with the another surface of the insulating layer, the second portion blocking an entirety of the first end of the through-hole such that a surface of the second portion does not intrude into the through-hole, the third portion partially blocking the second end of the through-hole such that a surface of the third portion intrudes into the through-hole to extend along the inner circumferential surface of the through-hole.

2. The printed circuit hoard as claimed in claim 1, wherein the average thickness of the insulating layer is greater than or equal to 10 μm and less than or equal to 40 μm,
wherein the average thickness of the conductive layer is greater than or equal to 0.15 μm and less than or equal to 0.3 μm, and
wherein the average thickness of the metal plating layers is greater than or equal to μm and less than or equal to 30 μm.

* * * * *